May 5, 1959 L. PESSEL 2,885,601

INSULATION OF PRINTED CIRCUITS

Filed May 28, 1954

INVENTOR.
LEOPOLD PESSEL
BY
J. L. Whittaker 2,885,601
Patented May 5, 1959

2,885,601

INSULATION OF PRINTED CIRCUITS

Leopold Pessel, Wyndmoor, Pa., assignor to Radio Corporation of America, a corporation of Delaware Application May 28, 1954, Serial No. 432,951
7 Claims. (Cl. 317—101)

This invention relates generally to an improved method of soldering closely spaced conductive elements such as electrical circuits and to improve devices resulting therefrom, and particularly to an improved method of inhibiting soldering of some of the conductors of a complex network while simultaneously soldering the remaining conductors and all of the connections of an assembly in which all of the electrical conductors are disposed on a surface of electrically insulating material.

In the operation of dip soldering printed circuit assemblies having a plurality of closely spaced conductors, such as in the form of spiral-type inductances, undesired solder bridging normally occurs between adjacent conductors. Moreover, when such closely spaced conductors carry an appreciable electrical voltage, there is a tendency for arcing and short-circuiting to occur.

One object of the present invention is to provide an improved dip soldering technique applicable to printed circuits.

Another object of the invention is to provide an improved process of dip soldering printed circuits where the conductors are integrally united to a surface of an insulated material.

Another object of the invention is to provide a method of excluding solder and flux from selected portions of a printed circuit assembly during the process of dip soldering.

Another object of the invention is to provide an improved method of insulating printed circuits against high voltage breakdown.

Still another object of the invention is to provide an electrical circuit assembly insulated against electrical breakdown and hot solder.

The present invention comprises an improved method of covering closely spaced conductors in printed circuits to prevent solder from coating the conductors and thereby bridging or decreasing the spacing between the conductors. The presence of the coating on the closely spaced conductors thus tends to inhibit high voltage electrical breakdown when the circuit is in use. In an assembly of components to be soldered to a printed circuit, an insulating medium is applied to certain of the conductors to prevent solder from adhering thereto. The insulating medium comprises two materials having separate functions. Both of these materials should possess high thermal stability and good electrical insulating characteristics. One of the materials preferably is a tacky, liquid, adhesive-paste material which is applied over and between the closely spaced electrical conductors in a printed circuit network. This first layer performs two vital functions: (1) Its application to the surface permits the elimination of air spaces between the conducting elements on the insulated areas. These air spaces would facilitate voltage breakdown. The complete wetting with the first layer of the areas being protected minimizes voltage breakdown. (2) Since the first layer is permanently liquid, there is automatic resealing of the insulating material in the event of a flashover. A film or thin sheet of thermally stable insulating material, which may be flexible or rigid, is applied over the liquid electrical insulating layer. This second layer provides external protection.

The foregoing objects and advantages will be accomplished, and the invention will be more fully described by reference to the accompanying drawings of which:

Similar reference characters are applied to similar elements throughout the drawing.

In general, the dip-soldering process of the present invention includes an initial step of applying to certain selected electrical conductors in a printed circuit assembly, for example, conductors which are closely spaced, a tacky, viscous liquid electrical insulating material. Subsequently, a sheet-like insulating material is applied over the liquid material and cemented in place by the tacky liquid. Finally, the entire assembly is immersed in a bath of molten solder to form a plurality of electrical connections. One suitable method of carrying out the dip-soldering procedure is described in U.S. Patent 2,671,264 of the present inventor.

Examples of a process in accordance with the present invention are as follows:

*Example 1*

Figure 1:
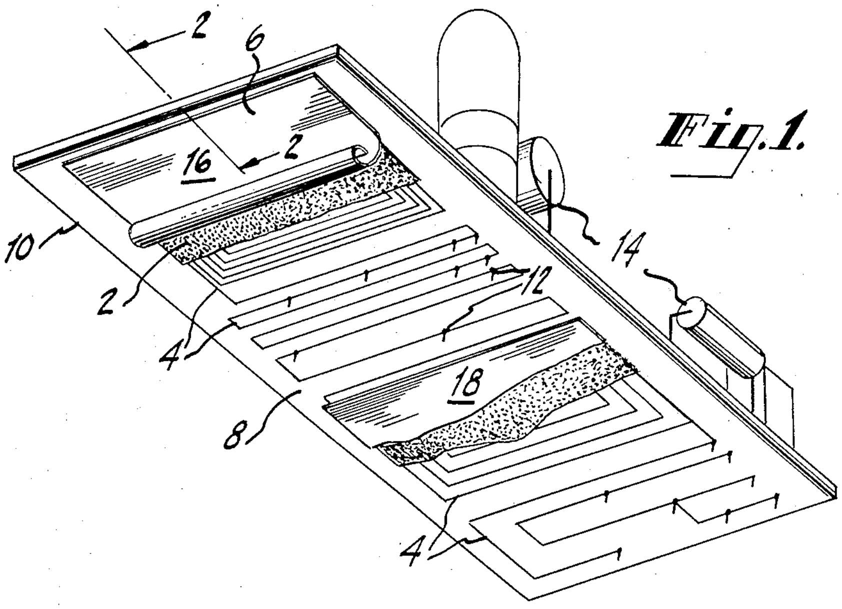
Figure 1 is a perspective view of the underside of a printed circuit panel, the upper side having circuit components mounted thereon, which is to be subjected to a dip-soldering operation according to the method of the present invention.
Figure 2:
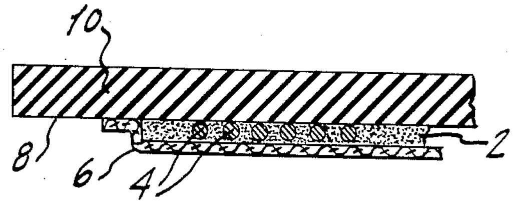
Figure 2 is a cross-sectional view along the section line 2—2 of Figure 1.
Figure 3:
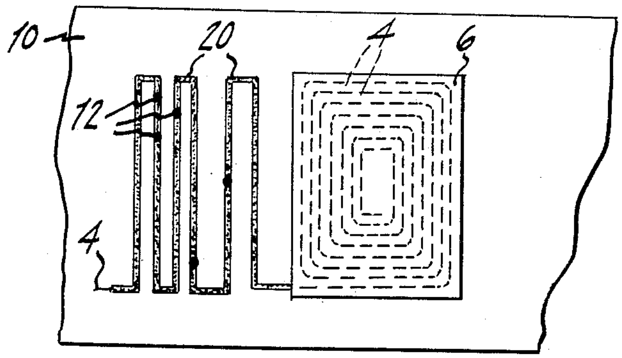
Figure 3 is a perspective view of part of the printed circuit assembly of Figure 1, after the dip-soldering operation according to the invention.

Referring now to Figures 1 and 2; a liquid composition 2 prepared by mixing one part by weight of Oronite, Polybutene No. 128, made by the Oronite Chemical Company, with three parts by weight of Vistanex LM—type MS (chemically a polybutene) made by Enjay Company, Incorporated, is heated on a hot plate to approximately 100° C., and the hot mixture is applied with a flexible spatula to those portions 16 and 18 of the conducting elements of a printed circuit 4 which are to be insulated. The liquid component should have a viscosity of at least 200,000 centistokes at 38° C. The so-called "printed circuit" 4, which may comprise a network of copper conductors united to the under surface 8 of a panel 10, composed of a number of laminated sheets of paper or other material impregnated with a phenolic resin, is first preheated to about 100° C. The liquid component is spread over the portions to be insulated in a thin uniform layer. To this is applied a film 6 approximately .002 inch thick of "Teflon," a polytetrafluoroethylene, manufactured by E. I. du Pont de Nemours. This flexible film is pressed upon the liquid-wetted areas where it adheres tightly. The bottom surface 8 of the panel 10, carrying the printed circuit including leads 12 from circuit components 14 mounted on the upper surface of the panel, is agitated in a solder bath, at about 250° C., for example, until good solder connections are established between the leads and the copper conductors and the copper lines of the circuit are well tinned 20 except on the areas covered by the above-described insulation as shown in Figure 3. Thus both flux and solder are kept away from the insulated portions of the circuit where the spacing between the lines may be as small as .01 inch.

*Example 2*

Referring again to Figures 1 and 2; Silicone Gum SE-76, 2, a silicone manufactured by the General Electric Company is applied to the printed circuit conducting element 4, as described in Example 1, and covered by a sheet 6 of silicone-varnish-impregnated fiber-glass fabric. The partially masked printed circuit assembly then is dip-soldered according to usual dip-soldering procedure. The resulting mechanical and electrical characteristics of this insulation are similar to those described in Example 1.

Ordinarily, when a material such as polybutene is used as the undercoat of tacky liquid, this material must be preheated in order to spread easily throughout the network of electrical conductors. This material may be applied by brushing, dipping, rolling, calendaring, spraying, dripping or wiping. Indeed, any suitable means for applying a viscous liquid will be useful in the practice of this part of the present invention.

The liquid component when applied to the circuit before the sheet-like material permits the complete elimination of air spaces among the conducting elements on the insulating areas. These air spaces facilitate voltage breakdown. Ordinarily, if an electrical insulating tape, alone, is used, it does not wet all of the areas to be insulated and some air is trapped under the tape. By applying a separate liquid layer, air is excluded from the treated areas. This complete wetting of the areas being protected is necessary to minimize voltage breakdown. Because this first layer is permanently liquid, there is automatic resealing following a flashover.

A material suitable for the liquid coat according to the present invention should have a viscosity of at least about 200,000 centistokes at 38° C., a high degree of tackiness, a high boiling point and very low vapor pressure at elevated temperatures, good thermal stability at temperatures to which it will be subjected in the solder bath, resistance against oxidation, high electrical resistivity and voltage breakdown resistance, and be markedly hydrophobic. The breakdown voltage of the liquid should be on the order of at least 40,000 volts for a 0.1 inch gap at 80° C. Many organic liquids have these properties. Other examples of several suitable liquids are:

(1) "Sundex 170": A heavy petroleum base oil, made by Sun Oil Corporation, Philadelphia, Pennsylvania.

(2) "Clorafin 42": A chlorinated paraffine oil made by Hercules Powder Company, Wilmington, Delaware.

(3) "Sunny South No. 11": A rosin oil made by the Glidden Company, Jacksonville, Florida.

(4) "Styphen I, Blend 9": Tris (alphamethylbenzyl) phenol mixture made by Dow Chemical Company, Midland, Michigan.

(5) "Poly-Amide M–211": Tetranaphthenoyl Triethylene Tetramine made by Dearborn Chemical Company, Chicago, Illinois.

(6) N–080: Nitrile of a long-chain fatty acid, made by the Armour Chemical Division, Chicago, Illinois.

The second component is a sheet or film-like material characterized by resistance against the dissolving effect of hot solder fluxes, mechanical and chemical structural stability when exposed to molten solder, and a great resistance against moisture penetration. Suitable materials are polymerized derivatives of halogenated polythenes such as polytetrafluoroethylene, chlorinated fluorocarbons, such as polymerized trifluorochloroethylene, resin impregnated textiles, such as resin-impregnated fiber-glass sheet, and asbestos-paper-impregnated with polyester resins like "Quinterra," made by Johns Manville Corporation, New York, New York. Other sheet and foil-like electrical insulating materials fulfilling the above-stated requirements can also be used.

Thus the invention provides protection of a printed circuit against voltage breakdown, moisture penetration, solder flux, and solder by the preliminary application to the circuit of a liquid having good dielectric properties and high viscosity, followed by the application, with suitable heat and pressure, of a film material, the desirable properties of which are mechanical stability and resistance against heat, hot solder flux, flux solvents and moisture.

There have thus been described new insulating materials and an improved method of dip-soldering electrical circuit assemblies with such insulating materials.

What is claimed is:

1. In a method of soldering selected portions of a network of conductors mounted on a panel of insulating material by immersing said conductors in a solder bath, the improvement comprising coating the surfaces over and between selected portions of said network with a viscous, permanently liquid, thermo-stable, adhesive, electrically insulating fluid, applying over said fluid a sheet-like mechanically-stable and electrically-insulating hydrophobic film which is thermally-stable at the temperature of the solder bath, and thereafter dipping said coated panel in said solder bath.

2. A method according to claim 1 wherein the sheet-like film is a polytetrafluoroethylene.

3. A method according to claim 1 wherein the insulating fluid is a polybutene and the sheet-like film is a polytetrafluoroethylene.

4. An article of manufacture comprising a network of electrical conductors disposed upon the surface of a sheet of insulating material, a viscous, permanently liquid, thermostable, adhesive, electrically insulating fluid spread over a portion of said surface and insulating said network, a sheet-like film which is mechanically-stable, thermally-stable, electrically insulating and hydrophobic, disposed upon said insulating liquid, and a solder coating adhering to those portions of the network which are not covered by said insulating fluid.

5. An article of manufacture comprising a network of electrical conductors disposed upon a sheet of insulating material, a viscous, permanently liquid, thermostable, adhesive, electrically insulating paste spread over said surface and insulating said network and a sheet-like film which is mechanically-stable, thermally-stable, electrically insulating and hydrophobic, disposed upon said insulating liquid.

6. An article of manufacture comprising a plurality of electrical conductors disposed upon the surface of a sheet of insulating material, a viscous, permanently liquid, thermostable, adhesive, electrically insulating fluid disposed upon a selected area of said surface and insulating said conductors and a sheet-like film which is mechanically-stable, thermallystable, electrically insulating and hydrophobic, disposed upon said insulating fluid.

7. An article of manufacture comprising a plurality of electrical conductors disposed upon the surface of a sheet of insulating material, a tacky, viscous, permanently liquid, thermostable, adhesive, electrically insulating fluid disposed upon a selected area of said surface and insulating said conductors, and a film of polytetrafluoroethylene disposed upon said insulating fluid.

References Cited in the file of this patent

UNITED STATES PATENTS

| | | |
|---|---|---|
| 1,718,993 | Wermine | July 2, 1929 |
| 2,473,887 | Jennings | June 21, 1949 |
| 2,607,821 | Van Arsdell | Aug. 19, 1952 |
| 2,671,264 | Pessel | Mar. 9, 1954 |
| 2,695,351 | Beck | Nov. 23, 1954 |
| 2,756,485 | Abramson | July 31, 1956 |

OTHER REFERENCES

Enjay: Vistanex (Polyisobutylene) Processing and Compounding. A pamphlet copyrighted by Enjay Co., Inc., 15 West 51st St., New York 19, New York.